(12) United States Patent
Morris et al.

(10) Patent No.: US 10,791,385 B2
(45) Date of Patent: Sep. 29, 2020

(54) OPTICAL TO ELECTRICAL CONVERSION MODULE

(71) Applicant: Hewlett Packard Enterprise Development LP, Houston, TX (US)

(72) Inventors: Terrel Morris, Garland, TX (US); John Norton, Houston, TX (US); Daniel Alan Berkram, Loveland, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/147,481

(22) Filed: Sep. 28, 2018

(65) Prior Publication Data

US 2020/0107087 A1    Apr. 2, 2020

(51) Int. Cl.
| | | |
|---|---|---|
| *H04J 14/00* | (2006.01) |
| *H04Q 11/00* | (2006.01) |
| *G02B 6/42* | (2006.01) |
| *H05K 1/18* | (2006.01) |
| *H05K 1/02* | (2006.01) |
| *H05K 1/11* | (2006.01) |
| *H05K 7/14* | (2006.01) |

(Continued)

(52) U.S. Cl.
CPC ......... *H04Q 11/0071* (2013.01); *G02B 6/428* (2013.01); *G02B 6/4269* (2013.01); *G02B 6/4277* (2013.01); *G02B 6/4278* (2013.01); *G02B 6/4292* (2013.01); *H04Q 11/0005* (2013.01); *H05K 1/0206* (2013.01); *H05K 1/115* (2013.01); *H05K 1/181* (2013.01); *H05K 7/1489* (2013.01); *H01R 12/72* (2013.01); *H01R 12/75* (2013.01); *H04Q 2011/009* (2013.01); *H04Q 2011/0016* (2013.01); *H04Q 2213/003* (2013.01); *H05K 2201/066* (2013.01); *H05K 2201/10121* (2013.01); *H05K 2201/10545* (2013.01)

(58) Field of Classification Search
CPC .................................................. G02B 6/4269
See application file for complete search history.

(56) References Cited

U.S. PATENT DOCUMENTS

| | | |
|---|---|---|
| 6,807,345 B2 | 10/2004 | Simon |
| 7,112,885 B2 | 9/2006 | Chen et al. |
| 8,488,921 B2 | 7/2013 | Doany et al. |

(Continued)

OTHER PUBLICATIONS

Coretek, "Six Channel Video QSFP+ Transceiver", Oct. 30, 2017, All pages.*

(Continued)

*Primary Examiner* — David C Payne
*Assistant Examiner* — Pranesh K Barua
(74) *Attorney, Agent, or Firm* — Hewlett Packard Enterprise Patent Department

(57) ABSTRACT

A pluggable module is provided for converting an optical signal to a plurality of electrical signals. The pluggable module may include a printable circuit board (PCB) and an optical connector disposed on a first side of the PCB. The optical connector may route any received optical signal to an optical to electrical transceiver. The optical to electrical transceiver may convert the optical signal to an electrical signal and route the electrical signal to an electrical connector mounted on a second, opposite side of the PCB.

19 Claims, 9 Drawing Sheets

(51) Int. Cl.
    *H01R 12/72*         (2011.01)
    *H01R 12/75*         (2011.01)

(56) References Cited

U.S. PATENT DOCUMENTS

| | | | | |
|---|---|---|---|---|
| 8,532,500 | B1* | 9/2013 | Wach | H04B 10/697 |
| | | | | 398/202 |
| 9,322,987 | B2 | 4/2016 | Doany et al. | |
| 9,645,334 | B2* | 5/2017 | Ishii | G02B 6/4272 |
| 9,874,688 | B2 | 1/2018 | Doerr et al. | |
| 9,983,370 | B1* | 5/2018 | Mahoney | H05K 7/20418 |
| 2002/0131730 | A1* | 9/2002 | Keeble | H01R 12/716 |
| | | | | 385/92 |
| 2004/0047637 | A1* | 3/2004 | Wang | H05K 1/114 |
| | | | | 398/164 |
| 2004/0120652 | A1* | 6/2004 | Chong, Jr. | G02B 6/43 |
| | | | | 385/73 |
| 2007/0237464 | A1* | 10/2007 | Aronson | G02B 6/4416 |
| | | | | 385/89 |
| 2009/0016685 | A1* | 1/2009 | Hudgins | H04B 10/40 |
| | | | | 385/92 |
| 2010/0150569 | A1* | 6/2010 | Umnov | G02B 6/3897 |
| | | | | 398/139 |
| 2011/0135316 | A1* | 6/2011 | Fankhauser | G02B 6/4453 |
| | | | | 398/164 |
| 2011/0255574 | A1* | 10/2011 | Carter | H04B 10/40 |
| | | | | 375/214 |
| 2014/0010514 | A1* | 1/2014 | McColloch | G02B 6/4261 |
| | | | | 385/136 |
| 2014/0056592 | A1* | 2/2014 | McColloch | H04B 10/40 |
| | | | | 398/135 |
| 2014/0160679 | A1* | 6/2014 | Kelty | H05K 7/20672 |
| | | | | 361/700 |
| 2014/0185988 | A1* | 7/2014 | Qi | G02B 6/4278 |
| | | | | 385/77 |
| 2014/0321061 | A1* | 10/2014 | Moore | H05K 9/0058 |
| | | | | 361/709 |
| 2015/0316732 | A1* | 11/2015 | Schamuhn | H04B 10/40 |
| | | | | 398/139 |
| 2017/0023751 | A1* | 1/2017 | Steijer | G02B 6/4292 |
| 2017/0364295 | A1* | 12/2017 | Sardinha | G06F 3/0655 |
| 2018/0049348 | A1* | 2/2018 | Bucher | G02B 6/4271 |
| 2018/0116063 | A1* | 4/2018 | Tracy | H05K 7/1427 |
| 2018/0277971 | A1* | 9/2018 | Lu | H04L 29/06088 |
| 2018/0310435 | A1* | 10/2018 | Sharf | H01R 13/6587 |

OTHER PUBLICATIONS

Mitsubishi Cable Co; "Fiber Optics Products"; printed from webpage: http://www.mitsubishi-cable.co.jp/en/products/group/optical-fiber/bundle.html; on Aug. 24, 2018; 2 pages.

* cited by examiner

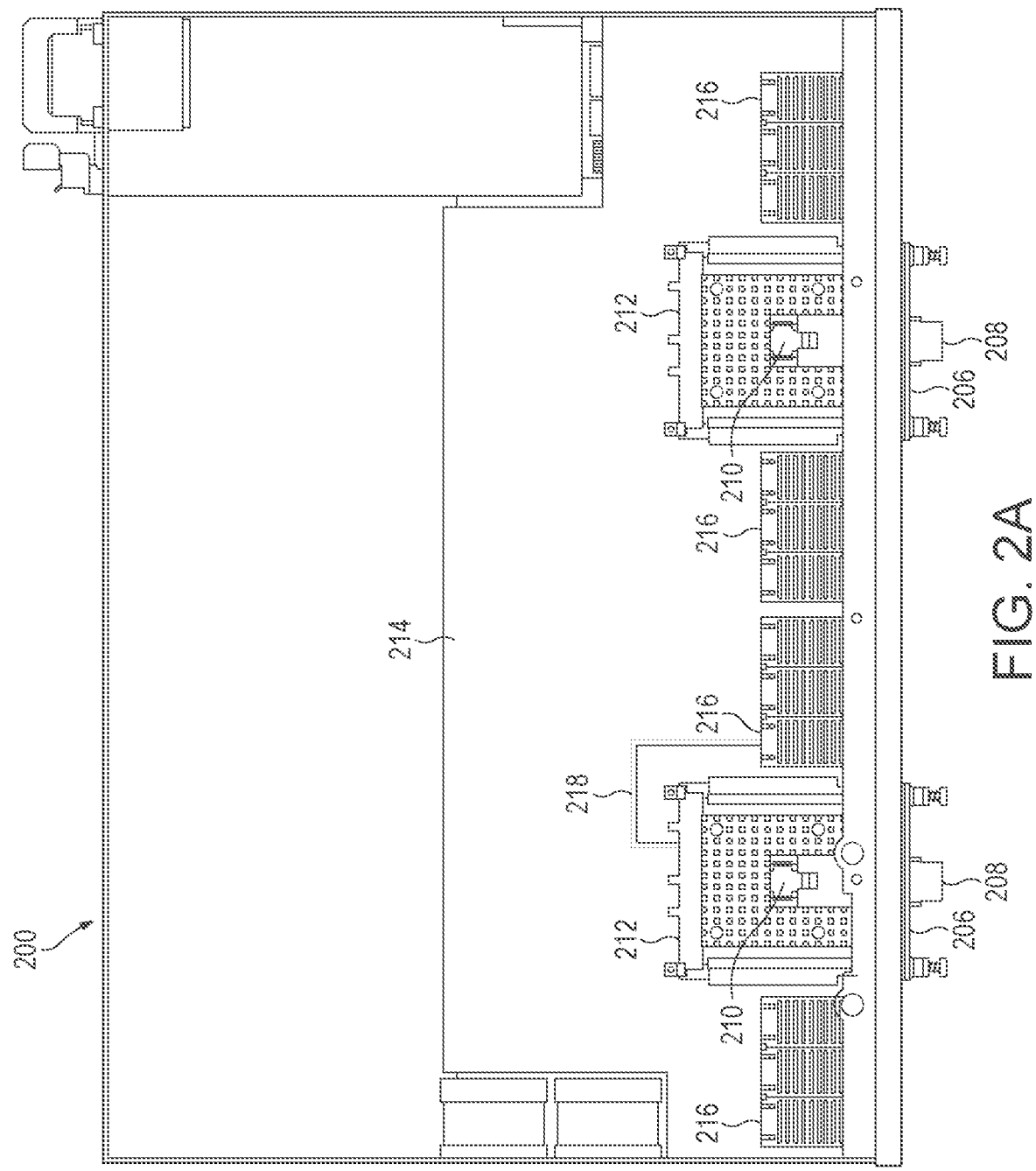

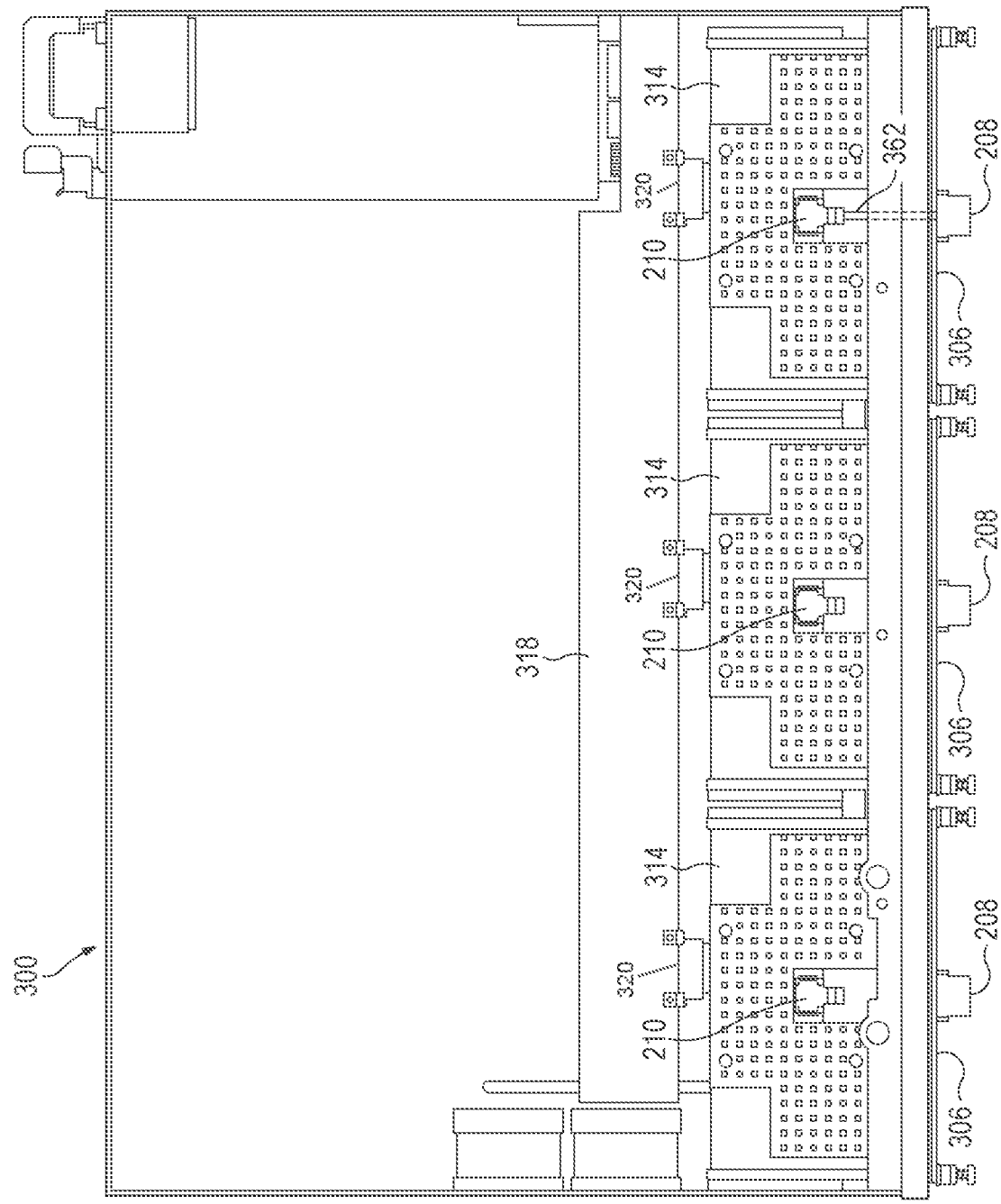

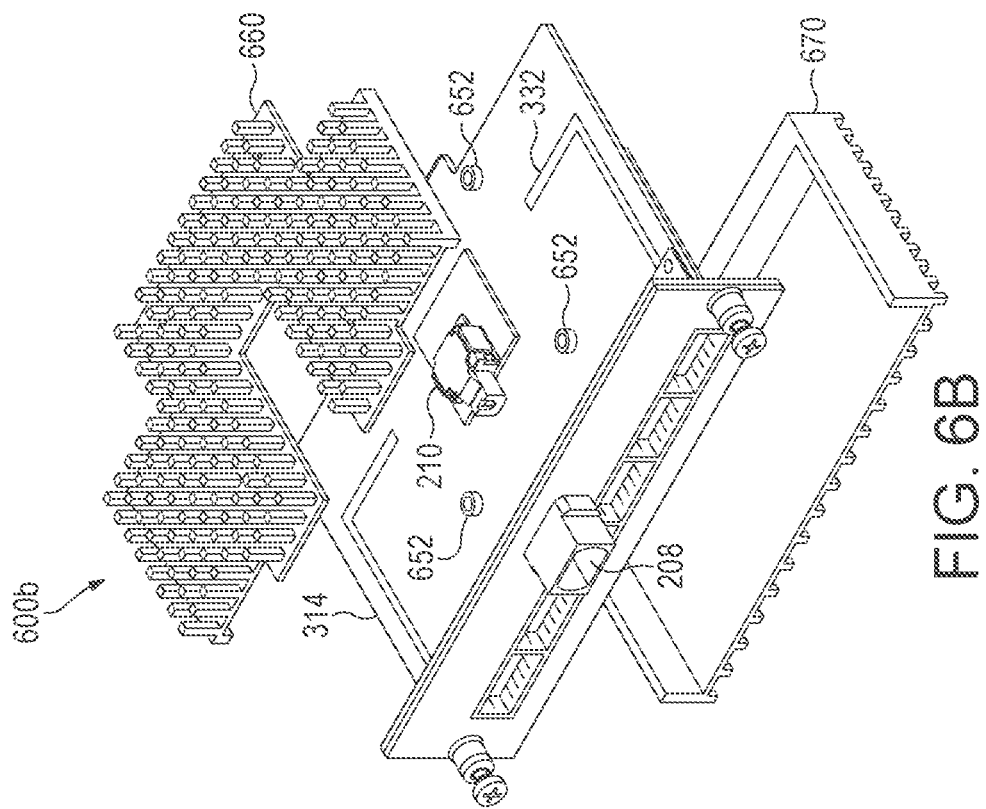
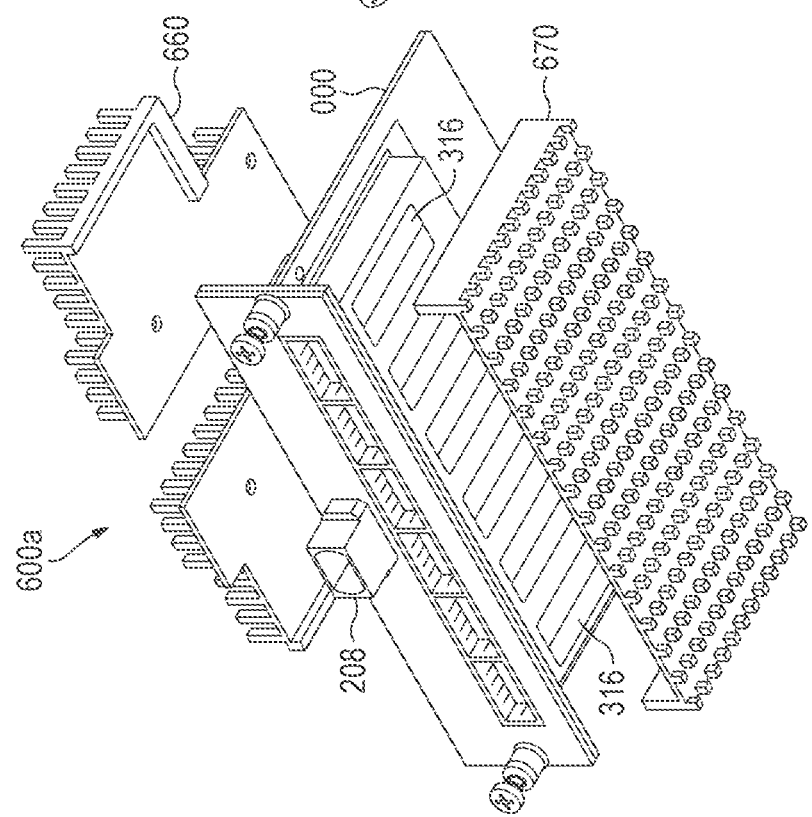
FIG. 6B
FIG. 6A

OPTICAL TO ELECTRICAL CONVERSION MODULE

BACKGROUND

As numbers of computers, particularly servers, are deployed in large-scale or hyper-scale data center applications, the need to connect those computers to one another at massive scale as well as connecting them to the outside world has driven change in data center networking topologies and strategies. Two of the primary drivers of cost and performance in these large networks are the network topology and the photonic interconnections between them. Low-cost low-radix switches connected to other low-radix switches via multiple copper and optical connections are often utilized. As data rates increase across networks, the distances that data signals can traverse in copper cables diminishes as a result of signal integrity loss in the copper medium. Therefore, optical cables are often utilized for longer distance travel, as the signal traverse distance for optical cables is significantly longer than that of copper cables.

Optical cables however, may be more costly to produce than their copper counterpart. Present optical solutions, which are cost-effective solutions when used to traverse long distances, become inefficient when used to traverse shorter distances. As a result, cost-reduction exercises have developed high-channel-count solutions that amortize the cost of cable attachment and packaging across a larger number of connections. Where current solutions may use optical engines with 4 channels or perhaps 8 channels for example, these high-density solutions may favor relatively higher channel counts, e.g. 24-36 channels.

BRIEF DESCRIPTION OF THE DRAWINGS

So that the manner in which the recited features, advantages and objects of the present disclosure may be understood in detail, a more particular description of the invention, briefly summarized above, may be had by reference to the examples thereof which are illustrated in the appended drawings. It is to be noted, however, that the appended drawings illustrate only typical examples of this invention and are therefore not to be considered limiting of its scope, for the invention may admit to other equally effective examples.

FIGS. 2A and 2B illustrate an example system having modules for converting an optical signal into a plurality of electrical signals.

FIGS. 3A and 3B illustrate an example system having pluggable modules for converting an optical signal into a plurality of electrical signals.

FIGS. 6A and 6B are block diagrams of a system level view of a pluggable module for converting an optical signal into a plurality of electrical signals.

DETAILED DESCRIPTION OF SPECIFIC EXAMPLES

Figure 1:
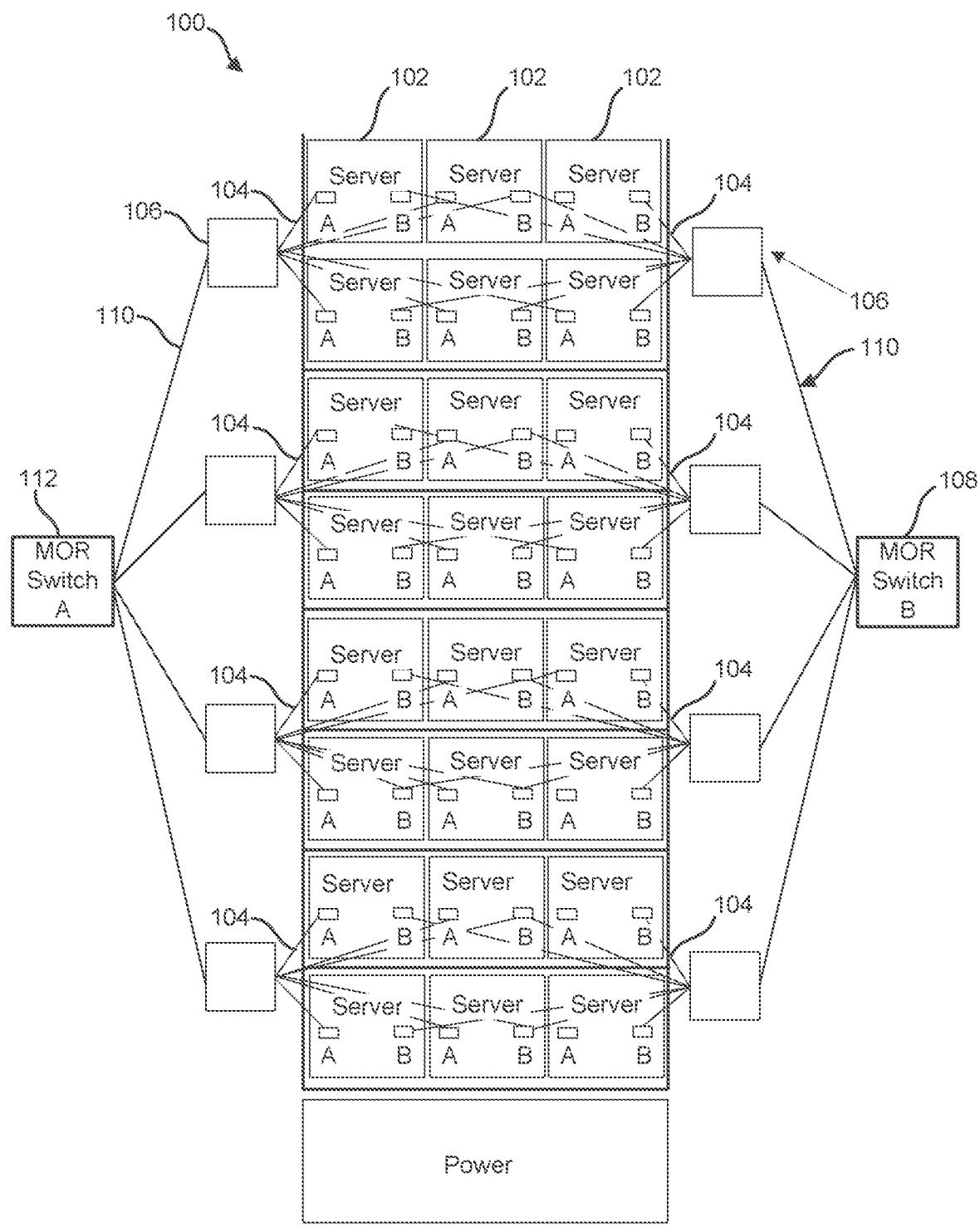
FIG. 1 illustrates an example rack-level module schematic.

Coupling 24-channel or 36-channel cables directly to computer servers is not efficient due to over-provisioning. Likewise, coupling 4-channel solutions to a plurality of servers is inefficient due to duplicative packaging costs. As more networks seek to use high-radix switches in order to remove layers from the network hierarchy, they are challenged by the costs of the final layer connection to the servers. Since the connection between a high-radix middle-of-row switch and a large array of servers results in making many connections, and the array of servers are typically in different equipment racks, the preferred effectiveness of optical transceivers is at odds with the low-cost solution copper connectors provide.

Minimizing wired copper connections to servers allows for longer data transmission lengths provided by fiber optical connections; however optical fiber connections may be costly. Further, legacy servers output electrical signals and it is desirable to provide a cost-effective system that continues to provide the ability to use legacy server equipment. Accordingly, a means is provided to fan out an optical fiber connection into various electrical signals transmitted over electrical channels at a data rate consumable by servers today.

In the following, reference is made to examples of the inventive concept of this disclosure. However, it should be understood that the inventive concept is not limited to described examples. Instead, any combination of the following features, elements, or functionalities, whether related to different examples or not, is contemplated by the inventors as a possible combination that may be used to implement and practice an aspect of the present innovation. Furthermore, in various examples the innovation of this disclosure provides numerous advantages over the prior art, and although the examples of the present innovation may achieve advantages over other possible solutions and/or over the prior art, whether or not a particular advantage is achieved by a given example is also not intended to be limiting on the scope of the present disclosure. Therefore, the following aspects, features, functionalities, examples, and advantages are intended to be merely illustrative and are not considered elements or limitations of the appended claims, except where explicitly recited in a claim. Similarly, reference to "the invention" or "the innovation" are not to be construed as a generalization of any inventive subject matter disclosed herein and shall not be considered to be an element or limitation of the appended claims except where explicitly recited in a claim.

Example embodiments of the present disclosure provide a rack-level solution using CWDM photonic modules to convert optical signals to multiple electrical signals in a cost effective manner. Example embodiments of the disclosure provide mechanical, electrical, power, and/or cooling solutions in a single rack-level infrastructure that also allows hot-swap of the photonic modules.

FIG. 1 illustrates an example rack-level module schematic using a combination of copper and photonics connections to facilitate fully-redundant server connectivity. The example rack level module schematic 100 includes servers 102 having redundant A and B QFSP ports that are connected by copper cables 104, to pluggable modules 106. The pluggable modules 106 may include an optical connection which may, in some example implementations, be optically connected to an optical source or a switch, e.g. switch 108 or switch 112, via optical or photonic cables 110 (hereinafter referred to as optical cable 110). The optical cables used in this example can be used to connect to optical modules 106 via CWDM techniques, reducing the number of implemented fibers by a factor of 4. The example optical modules 106 provide 24 electrical channels per optical cable, and are thus able to supply 6 servers with 4-channel connections, consistent with Quad Small Form-factor Pluggable (QSFP) connectivity.

Pluggable modules 106 may be hot-swapped by unplugging optical cable 110 from the photonic connection of pluggable modules 106, and/or by unplugging any associated pluggable QSFP, and plugging in a like module to optical cable 110 and any unplugged QSFP. Hot swappable modules enable the replacement of modules while the system remains in operation, e.g. powered on. For instance, a pluggable module may be hot-swapped such that the operation of any other photonic or electronic unit not directly connected to module being swapped need not be disturbed upon servicing the pluggable module.

Since a typical server rack is 19 to 21 inches wide and in the present example pluggable modules 106 may be rack-level components, the longest copper cable connection length may be less than 0.5 meters, thus accommodating high speed gigabit signals, over 50 gigabits, for example, without significant degradation. The connection from pluggable modules 106 to switches 108, 112 may be individual optical cables having, for example, 24 channels per cable. Pluggable modules 106 may be coarse wavelength division multiplexer (CWDM) modules configured to convert the electrical signals received from servers 102 on copper cable 104 to optical signals that may be transmitted on optical cable 110 to switches 108, 112. As will be described below, the pluggable module 106 may provide connections to multiple QSFP ports, through optical cable 110.

The optical cable 110 may, for instance, be a twelve wide parallel fiber optical ribbon cable typically used with four colors of light to support signal transmission. The twelve fibers allow, as an example, for six send and six receive fibers to be used, and with each fiber having the ability to carry four distinct optical signal colors, the twelve wide fiber cable provides a total of 24 channels (6 fibers and 4 colors per direction). The twelve-fiber optical cable 110 provides 24 electrical channels to be carried across it in optical signals, and as such, photonic module 106 can package send and receive signals from 6 QFSP ports on servers 102 for transmission across the single 12 wide optical fiber to switch 108, 112. Although example configurations herein use a twelve wide optical fiber ribbon cable, the inventive concepts are not limited to any particular size, width, or type of optical fiber or connection, as the configurations scale up or down easily.

Non-CWDM multimode VCSEL implementations may be accommodated by using 24 fibers per direction, and single-mode CWDM implementations may be accommodated by using 12 single-mode fibers and single-mode connectors. In an example implementation, the size may be altered to accommodate specific rack topologies, e.g., a module having 32 channels and 8 QSFP connectors. Additionally, Small Form-Factor Pluggable (SFP) connectors, Quad Small Form Factor Pluggable Double Density (QSFP-DD) connectors, and Octal Small Format Pluggable (OSFP) connectors may be used in the correct ratios. For example, a module having 32 channels may be implemented with 4 QSFP-DD connectors.

Pluggable modules 106 may be positioned rack level, i.e., the module may be built integral to the server rack and therefore positioned next to, adjacent, or near the servers 102 by being built directly into the server rack that physically supports servers 102, or in a sub-chassis that attaches to the vertical rack rail. This rack level positioning of the optics module 406 allows for simplification of the server QSFP port wiring, as specific wire lengths may be used for each server port. For example, the wire length for the connection to server 1 may be shorter than the wire length for the connection to server 2, thus indicating to a server technician that the wires for server 1 cannot be plugged into any other server by mistake. This length designated wire configuration allows for reduced wiring errors and facilitates efficient and proper connection of server ports to pluggable modules 106. Further, the configuration of the current example allows for legacy server technology and configurations to be unchanged, as the send/receive QSFP ports on the servers remain unchanged, thus allowing legacy servers with electrical connections to readily connect to pluggable modules 106 of the present example, thus avoiding the costly process of upgrading to optical or photonic servers. Two-channel versions may also be used, e.g. the utilization of 2 of the 4 available QSFP channels if desired.

Figure 2B:
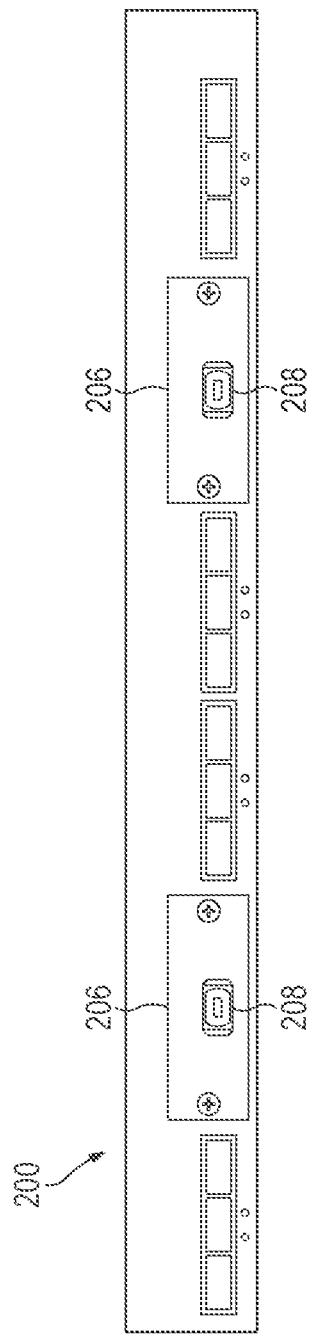

FIGS. 2A and 2B illustrate an example system 200 having modules 206 for converting an optical signal into a plurality of electrical signals. FIG. 2A illustrates a top perspective view of system 200, while FIG. 2B represents a front perspective view of system 200. While two example modules 206 are shown in system 200, system 200 may include any number of modules 206. Modules 206 may include an optical connector 208 to receive an external optical cable (not shown). The optical cable may transmit an optical signal to optical connector 208 and the received optical signal may be routed to optical to electrical transceiver 210. Optical to electrical transceiver 210 converts the optical signal to an electrical signal, and may transmit the converted electrical signal to edge connector 212.

Edge connector 212 may connect electrical channels of module 206 to electrical channels of printable circuit board (PCB) 214. In an example, edge connector 212 may route the received electrical signal across 96 electrical channels of PCB 214. In this example implementation, the electrical signals are routed from edge connector 212 all the way to electrical connectors 216 disposed adjacent to modules 206, as illustrated in example route 218.

Electrical connectors 216 may be pluggable and in an example implementation, may be Quad Small Form-factor Pluggables (QSFPs). The QSFPs may be hot-swappable and may receive an active or passive electrical copper cable that is external to module 206. In this example implementation, three such electrical connectors 216 are shown on either side of each pluggable module 206. However, any number of electrical connectors may be implemented.

Figure 3B:
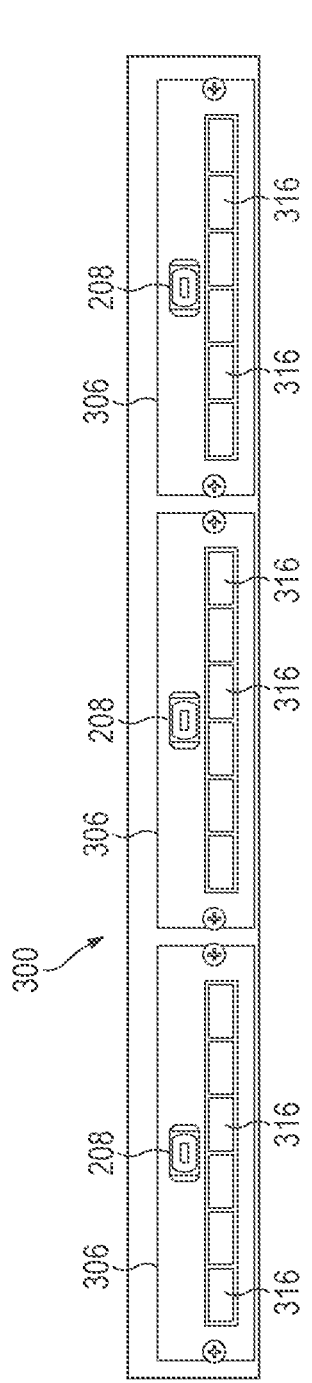

FIGS. 3A and 3B illustrate an example system 300 having pluggable modules 306 for converting an optical signal into a plurality of electrical signals. FIG. 3A illustrates a top perspective view of system 300, while FIG. 3B represents a front perspective view of system 300. System 300 may be a chassis housing pluggable modules 306. While three example pluggable modules are illustrated, any number of pluggable modules may be included within system 300.

Each of pluggable modules 306 may include similar components to those described in FIG. 2, including optical connector 208, and optical to electrical transceiver 210. As illustrated in FIG. 3, optical connector 208 may be disposed on a top side of pluggable module 306. Optical connector 208 may receive an optical signal over a connected optical cable. In an example, optical connector 208 may be configured to receive a hot-pluggable optical cable. Although each module is illustrated having a single optical connector 208, any number of optical connectors 208 may be implemented.

The optical cable may include multiple channels on a fiber by utilizing different colors of light. Thus, optical connector 208 may receive optical signals from many channels concurrently. For example, optical connector 208 may receive signals from 12 connected optical fibers, with each fiber transmitting signals across four different colors, enabling optical connector 208 to receive signals from 24 separate channels concurrently.

Any optical signal received at optical connector 208 may be routed to optical to electrical transceiver 210 across photonic cable 362. In an example, photonic cable 362 may be fixed within module 306, and may route an optical signal across a direct path on the top side of PCB 314 from optical connector 208 to optical to electrical transceiver 210. In an example implementation, optical to electrical transceiver 210, like optical connector 208, may be mounted on a top side of PCB 314.

Optical to electrical transceiver 210 may convert any received optical signal to any number of electrical signals. In some example implementations, optical to electrical transceiver 210 may include a demultiplexer, and may convert an optical signal into multiple, split electrical signals. Optical to electrical transceiver 210 may subsequently transmit any converted electrical signals to any number of electrical connectors.

Unlike electrical connectors 216 of FIG. 2, electrical connectors in the example configuration of FIG. 3 may be mounted on a bottom side of PCB 314. Thus, an optical signal may be converted to an electrical signal on a first side of the card, and the converted electrical signal may be routed through PCB 314 to an electrical connector located on a second, opposite side of the card. Because the electrical signal may be routed directly through PCB 314 to the opposite of side of the PCB, this configuration may result in a shorter route length for the converted electrical signal than if the electrical signal were to be routed across route 218 of FIG. 2. Additionally, and unlike the configuration illustrated in FIG. 2, the configuration of FIG. 3 enables a direct routing of the electrical signal from optical to electrical transceiver 210 to an electrical connector, without first passing through any additional connector, such as edge connector 212 of FIG. 2. As will be described below, some of the electrical connectors may, in some example implementations, be mounted on a top side of PCB 314.

An electrical connector may receive an electrical signal, and may enable the transmission of the received electrical signal across an electrical cable, such as a copper cable. Each module in FIG. 3 is illustrated as having 6 electrical ports 316 for connecting a copper cable to an electrical connector mounted on the bottom side of PCB 314. Although each module is illustrated with six included electrical ports 316, any number of electrical connections may be implemented. In an example implementation, and as illustrated in FIG. 1, each electrical connector may be connected to a copper cable e.g. copper cable 104, on a first end to transmit any received electrical signal to a server, e.g. server 102 connected to a second end of the copper cable. Thus, pluggable module 306 may receive an optical signal as input, and may output any number of corresponding electrical signals to be consumed by any number of servers.

In an example implementation, pluggable module 206 may include a manageability and power connector 320 on the back end of pluggable module 306. Manageability and power connector 320 may connect pluggable module 306 to an integrated printable circuit board (PCB) 318 of system 300. The integrated PCB 318 may provide power and management capabilities to pluggable module 306.

Unlike the configuration of PCB 314 or PCB 214 of FIG. 2, the configuration of PCB 318 facilitates a relative close proximity of the electrical connectors to pluggable module 306 in addition to a direct routing through PCB 318 to reduce the electrical trace lengths for achieving connectivity between optical to electrical transceiver 210 and electrical ports 316. Signal integrity is thus improved by shorter and more direct connections, including the elimination of an edge card connector, e.g. edge connector 212 of FIG. 2 in the signal path.

Figure 4B:
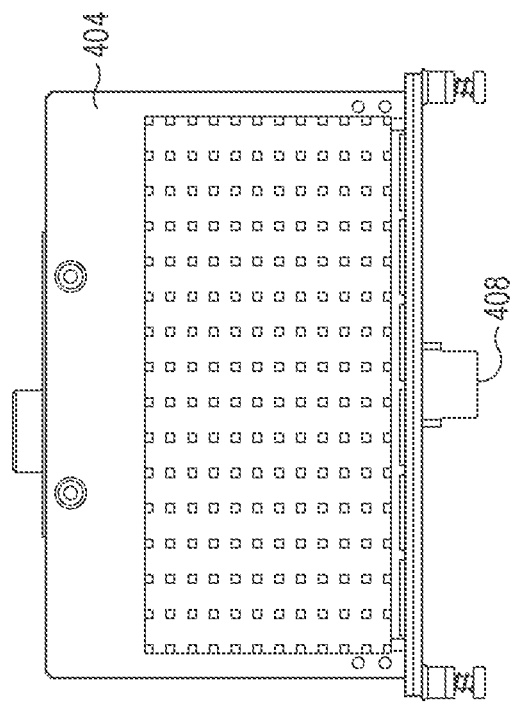
FIGS. 4A and 4B are block diagrams illustrating an example printed circuit board to be included in pluggable module.
Figure 4A:
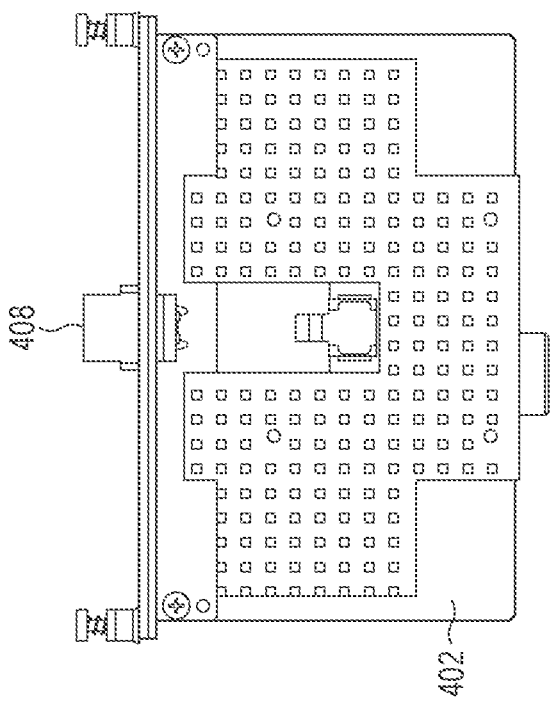

FIGS. 4A and 4B are block diagrams illustrating an example printed circuit board (PCB) 400 to be included in pluggable module 206. Specifically, a top side 402 of PCB 400 is illustrated in FIG. 4A, and a bottom side 404 of PCB 400 is illustrated in FIG. 4B. PCB 400 may, for example, be implemented as PCB 314 of FIG. 3. PCB 400 may include an optical connector 408 on first side 402 of PCB 400, and may be configured to receive a mountable optical to electrical transceiver 410 on first side 402. Optical connector 408 may receive a pluggable optical fiber cable (not shown).

PCB 400 may be configured to receive pluggable electrical connectors on second side 404 of PCB 400. Specifically, second side 404 of PCB 400 may be configured to mount pluggable electrical connectors, and may include any number of electrical connector ports for receiving copper cables (not shown) to be connected to the pluggable electrical connectors. As illustrated, PCB 400 may further include an optical to electrical transceiver 410 mounted on first side 402 of PCB 400.

Figure 5:
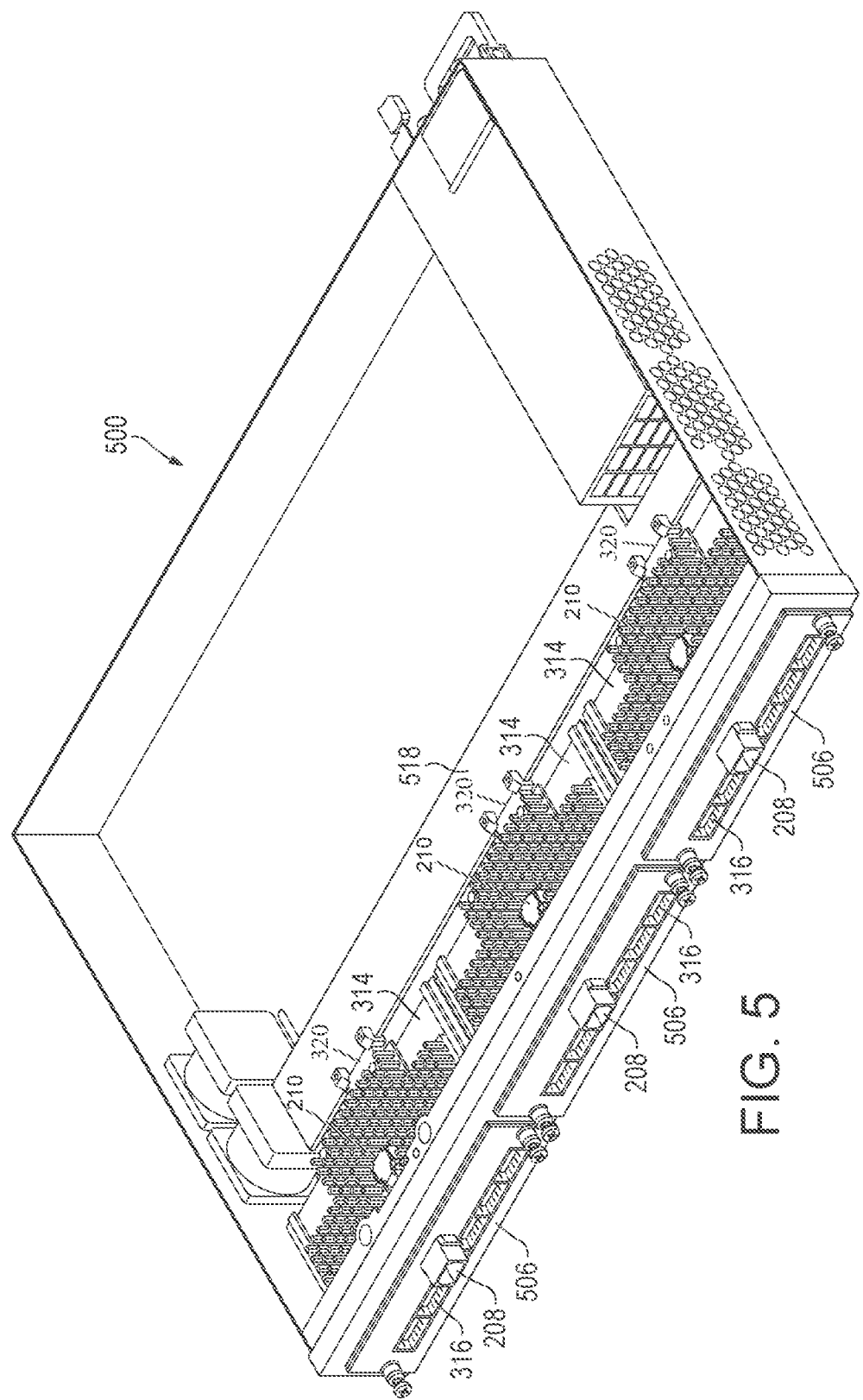
FIG. 5 is a block diagram illustrating another example system having pluggable modules for converting an optical signal into a plurality of electrical signals.

FIG. 5 is a block diagram illustrating another example system 500 having pluggable modules for converting an optical signal into a plurality of electrical signals. While three example modules 506 are shown in system 500, system 500 may include any number of modules. Modules 506 may include similar components to that of modules 306. Specifically, modules 506 may include including optical connector 208, optical to electrical transceiver 210, PCB 314, and manageability and power connector 320.

As illustrated in FIG. 5, optical connector 208 may be disposed on a top side of pluggable module 506. Optical connector 208 may receive an optical signal over a connected optical cable (not shown). Any received optical signal may be routed to optical to electrical transceiver 210. The optical signal may be transmitted to optical to electrical transceiver 210 via a photonic cable. In an example implementation, optical to electrical transceiver 210, like optical connector 208, may be mounted on a top side of PCB 314. PCB 314 of module 506 may act as a medium for signal transmissions across pluggable module 506 by including channels to route optical and/or electrical signals.

Optical to electrical transceiver 210 may convert any received optical signal to any number of electrical signals. In some example implementations, optical to electrical transceiver 210 may include a demultiplexer, and may convert an optical signal into multiple, split electrical signals to be routed through PCB 314. Optical to electrical transceiver 210 may subsequently transmit any converted electrical signals to any of electrical connectors 316.

Electrical connectors 316 may be mounted on a bottom side of PCB 314. Thus, an optical signal may be converted to an electrical signal on a first side of the card, and the converted electrical signal may be routed through PCB 314 to the electrical connectors 216 located on a second, opposite side of PCB 314. Routing the converted electrical signal directly through PCB 314 enables a direct routing of the electrical signal from optical to electrical transceiver 210 to electrical connector 316, without first passing through any additional connector.

Electrical connector 316 may receive an electrical signal, and may transmit the received electrical signal across an electrical cable (not shown), such as a copper cable. Although each module is illustrated with six included electrical connectors 316, any number of electrical connectors may be implemented. In an example implementation, and as illustrated in FIG. 1, each electrical connector 316 may be connected to a copper cable e.g. copper cable 104, on a first end to route any received electrical signal to a server, e.g. server 102 connected to a second end of the copper cable.

Pluggable module 506, like pluggable module 306, may also include a manageability and power connector 320 on the back end of pluggable module 206. Manageability and power connector 320 may connect pluggable module 206 to an integrated printable circuit board (PCB) 518 of system 500. The integrated PCB 518 may provide power and management capabilities to pluggable module 506. In some example implementations, PCB 518 may not enable high speed or high frequency signaling. Because the converted electrical signal is passed directly through PCB 314, integrated PCB 518 may not provide high speed signaling capabilities, thus cutting down on manufacturing costs of system 500.

FIGS. 6A and 6B are block diagrams of a system level view of a pluggable module 600 for converting an optical signal into a plurality of electrical signals. FIG. 6A is a bottom perspective view and FIG. 6B is a top perspective view of module 600. Module 600 may include similar components to that of modules 306. Specifically, module 600 may include including optical connector 208, optical to electrical transceiver 210, and PCB 314. Module 600 may further include electrical connectors 602 for outputting any received electrical signals.

As illustrated in FIG. 6, optical connector 208 may be disposed on a top side of pluggable module 306. Optical connector 208 may receive an optical signal over a connected optical cable (not shown). Any received optical signal may be routed to optical to electrical transceiver 210. The optical signal may be transmitted to optical to electrical transceiver 210 via a photonic cable. As shown in FIG. 6B, optical to electrical transceiver 210, like optical connector 208, may be mounted on a top side of PCB 314.

Optical to electrical transceiver 210 may transmit any converted electrical signals to any of electrical connectors 316. Electrical connectors 316 may be mounted on a bottom side of PCB 314. Thus, an optical signal may be converted to an electrical signal on the top side of the PCB 314, and the converted electrical signal may be routed through PCB 314 to the electrical connectors 216 located on the bottom side of PCB 314. Routing the converted electrical signal directly through PCB 314 enables a direct routing of the electrical signal from optical to electrical transceiver 210 to any of electrical connectors 316, without first passing through any additional connector.

Electrical connector 316 may receive an electrical signal, and may couple the received electrical signal across an electrical cable (not shown), such as a copper cable. Although each module is illustrated with six included electrical connectors 316, PCB 314 may be configured to receive any number of electrical connectors 316. In some example implementations, electrical connectors 316 may be hot-swappable. Each electrical connector 316 may be connected to a copper cable (not shown), at a first end of the copper cable to transmit any received electrical signal to a server, e.g. server 102, connected to a second end of the copper cable.

Module 600 may include means to transfer heat away from PCB 314. Heat generating components, such as components mounted to the top side of PCB 314, may generate significant amounts of heat while in operation, and heat transfer means may be utilized for cooling. One such means for heat transfer may include a heat sink 660 disposed on a top side of PCB 314. In another example implementation, the QSFP module connections on the bottom side of PCB act as a heat transfer means to cool PCB 314 by means of soldered connector cage pins protruding through PCB 314 combined with the surface area of the conductive connector "cage." The QSFP module connections are passive, such that the QSFP module connections do not generate energy, but store and dissipate energy. Heat transfer from the top side of PCB 314 to the electrical connectors 316 is further enhanced when conductive copper cables are plugged into electrical connectors 316, acting as additional heat transfer means. Accordingly, heat generating components mounted on a top side of PCB 314, such as optical to electrical transceiver 210, may generate heat that is passed through PCB 314, to the electrical connectors 316, and to the copper cables connected to electrical connectors 316.

Additional heat sink 670 may be disposed on a bottom side of PCB 314. Heatsink 660 and/or heatsink 670 may be of a thermally conductive material such as aluminum or copper, and may include any number of fins, e.g. fin 662a, or fin 662b to dissipate heat to the outside environment.

In an example implementation, any number of vias 652 may be implemented through PCB 314 to direct heat from a top side of PCB 314 to electrical connectors 316, or to heatsink 670. Vias 652 may, in some examples, direct heat from the top side of PCB 314 to electrical connectors 316. In this example, electrical wires (not shown) connected to electrical connectors 316 may include a thermally conductive material, e.g. copper, and may act as a heat transfer mechanism by carrying heat from electrical connectors 316 and away from PCB 314.

In another example implementation, PCB 314 may include a copper PCB layer 332. The copper PCB layer 332 may be thermally conductive, and may distribute and/or otherwise direct heat from the top side of PCB 314 to the bottom side of PCB layer 332 or vice versa. The PCB layer 332 may also be electrically conductive to prevent electromagnetic interference by containing any generated electromagnetic radiation generated by PCB 314.

Figure 7:
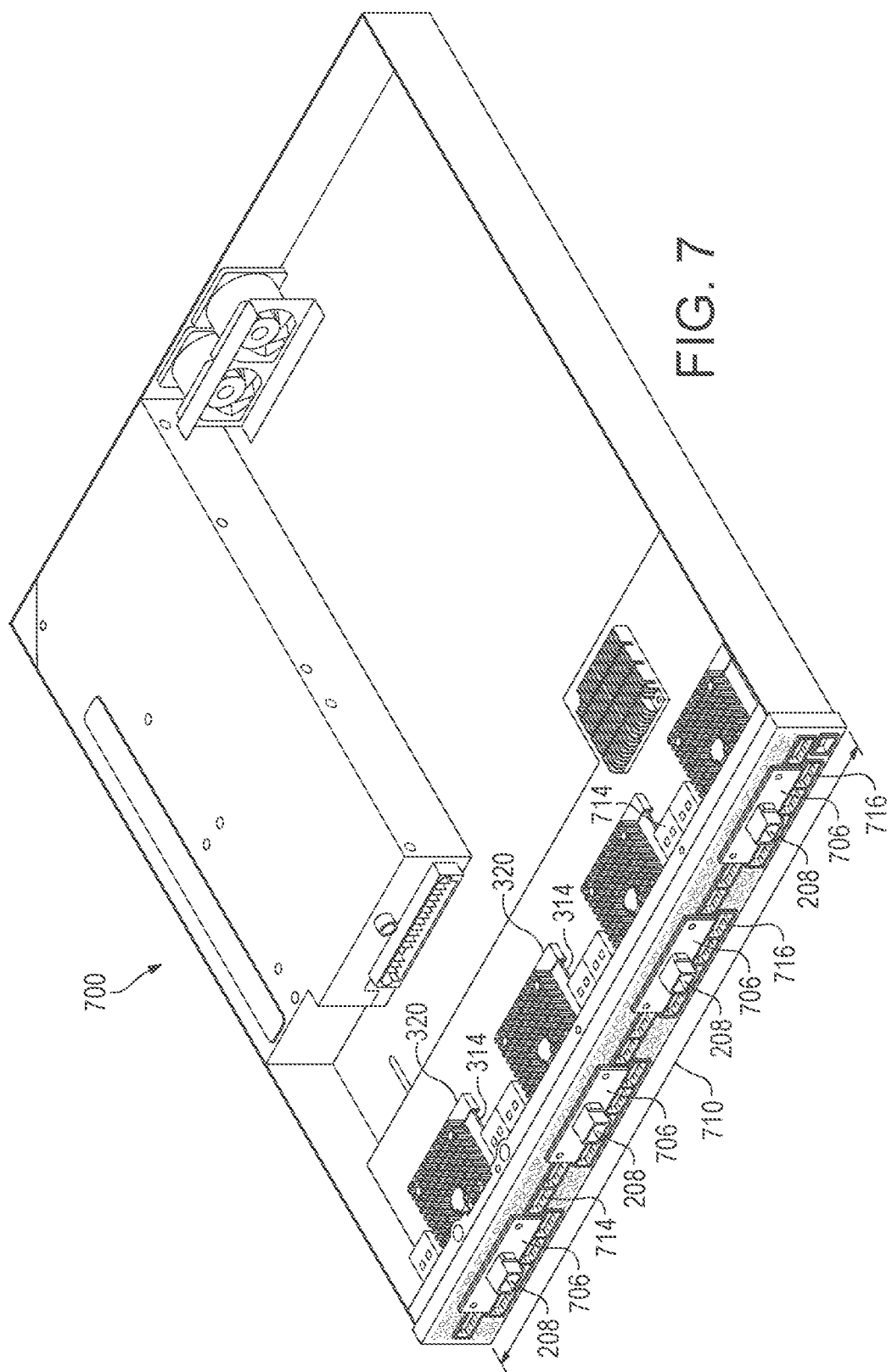
FIG. 7 is a block diagram illustrating another example system having pluggable modules for converting an optical signal into a plurality of electrical signals.

In an example implementation, any number of electrical connectors may be located on a top side of the PCB to reduce the dimensions of a module. FIG. 7 illustrates an example system 700 having pluggable modules 706 for converting an optical signal into a plurality of electrical signals. Modules 706 may include similar components to that of modules 306. Specifically, modules 706 may include including optical connector 208, PCB 314, and manageability and power connector 320.

As illustrated in system 700, pluggable modules 706 each include two electrical connectors 714 located on a top side of PCB 314 to reduce a total lateral dimension 710 of module 700, in addition to four electrical connectors 716 located on a bottom side of PCB 314. While two such electrical connectors 714 are located on a top side of PCB 314 and four such electrical connectors 716 are located on a bottom side of PCB 314, any number of electrical connectors may be located on a top side of PCB 314 and any number of electrical connectors greater than zero may be located on a bottom side of PCB 314. In an example, an optical to electrical transceiver (not shown) mounted on a top side of PCB 314 may convert a received optical signal to any number of electrical signals, and may route any number of the electrical signals to electrical connectors 714 located on a top side of PCB 314, and any number of the electrical signals to electrical connectors 716 located on a bottom side of PCB 314.

Figure 8:
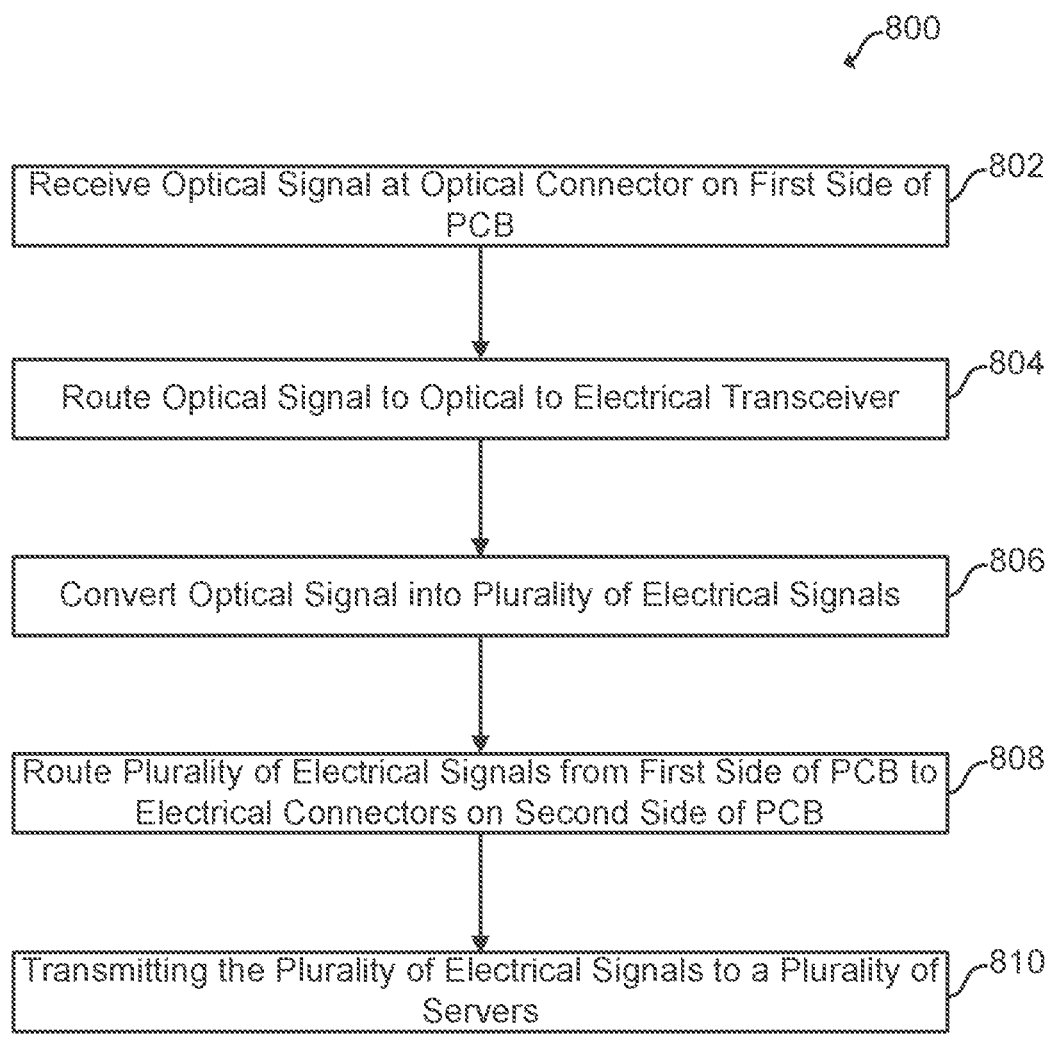
FIG. 8 is a flowchart illustrating an example method for converting an optical signal into a plurality of electrical signals.

FIG. 8 is a flowchart illustrating an example method 800 for converting an optical signal into a plurality of electrical signals. Although execution of method 800 is described below with reference to figures in the present Application, this is for explanatory purposes and other suitable components for execution of method 800 may be utilized. In some examples, steps of method 800 may be executed substantially concurrently or in a different order than shown in FIG. 8. In some examples, method 800 may include more or less steps than are shown in FIG. 8. In some examples, some of the steps of method 800 may, at certain times, be ongoing and/or may repeat.

At block 802, an optical signal may be received at an optical transceiver, e.g. optical connector 208 of FIG. 3. In an example, optical connector 208 may be disposed on a first side of a printable circuit board (PCB), e.g. PCB 314. At block 804, the optical signal may be routed to an optical to electrical transceiver, e.g. optical to electrical transceiver 210 of FIG. 3. In an example, the optical signal may be routed via a photonic cable from optical connector 208 to optical to electrical transceiver 210. In an example, optical to electrical transceiver 210 may be disposed on the first side of PCB 314 such that the optical signal is routed across the first side of PCB 314 to optical to electrical transceiver 210. At block 806, the optical signal may be converted into a plurality of electrical signals via optical to electrical transceiver 210.

At block 808, the plurality of electrical signals may be routed to a plurality of electrical connectors, e.g. electrical connectors 316. In an example implementation, the plurality of electrical connectors 316 may be disposed on a second side of PCB 314 such that the plurality of electrical signals are routed from the first side of PCB 314 to the second, opposite side of PCB 314. In an example implementation, the electrical signals do not pass through any connector when routed from optical to electrical transceiver 210 on the first side of the PCB to electrical connectors 316 on the second side of the PCB 314.

At block 810, the plurality of electrical signals may be transmitted to a plurality of servers. For example, each electrical connector 316 may be connected to a copper cable on a first end, e.g. copper cable 104 of FIG. 1, and a second end of copper cable 104 may be connected to a server, e.g. any of servers 102. Each electrical connector 316 may transmit any received electrical signal across copper cable 104 to the respective server 102 to which electrical connector 316 is connected.

In the preceding, reference is made to examples presented in this disclosure. However, the scope of the present disclosure is not limited to specific described examples. Instead, any combination of the following features and elements, whether related to different examples or not, is contemplated to implement and practice contemplated examples. Furthermore, although examples disclosed herein may achieve advantages over other possible solutions or over the prior art, whether or not a particular advantage is achieved by a given example is not limiting of the scope of the present disclosure. Thus, the preceding aspects, features, examples and advantages are merely illustrative and are not considered elements or limitations of the appended claims except where explicitly recited in a claim(s).

Examples presented in this disclosure are described above with reference to flowchart illustrations or block diagrams of methods, apparatus (systems) and computer program products according to examples disclosed herein. It will be understood that each block of the flowchart illustrations or block diagrams, and combinations of blocks in the flowchart illustrations or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks.

While the foregoing is directed to examples presented in this disclosure, other and further examples or variations may be devised without departing from the basic scope of contemplated examples, and the scope thereof is determined by the claims that follow.

The invention claimed is:

1. A pluggable module comprising:
a printable circuit board (PCB);
an optical connector mounted on a first side of the PCB, the optical connector configured to receive a plurality of optical signals, and to route the signals to an optical to electrical transceiver via a photonic cable across the first side of the PCB;
the optical to electrical transceiver configured to receive the plurality of optical signals and convert the optical signals into split electrical signals; and
a plurality of electrical connectors disposed on a second side of the PCB opposite the first side, each electrical connector configured to receive at least some of the split electrical signals from the optical to electrical transceiver and to absorb heat generated by the optical to electrical transceiver.

2. The pluggable module of claim 1, wherein the optical to electrical transceiver is mounted on the first side of the PCB.

3. The pluggable module of claim 1, wherein the PCB further includes a via that extends through the PCB from the first side to the second side of the PCB and is disposed adjacent to a first electrical connector of the electrical connectors to transfer heat from the optical to electrical transceiver to the first electrical connector.

4. The pluggable module of claim 1, wherein the electrical connectors are Quad Small Form-factor Pluggable (QSFP) connectors including a plurality of channels.

5. The pluggable module of claim 1, further comprising a power connector and a manageability connector configured to connect to a power and manageability PCB.

6. The pluggable module of claim 1, further comprising a heat sink disposed on the first side of the PCB.

7. The pluggable module of claim 6, further comprising a heat sink disposed on the second side of the PCB opposite the first side of the PCB.

8. The pluggable module of claim 7, wherein the PCB further includes a via that extends through the PCB to transfer heat from the optical to electrical transceiver to the heat sink.

9. The pluggable module of claim 1, wherein the PCB further includes a metal layer, to route heat from the first side of the PCB to the second opposite side, and to contain electro-magnetic interference generated on the PCB.

10. A chassis housing a plurality of modules, each module including:
   a printable circuit board (PCB);
   an optical connector configured to receive an optical signal on a first side of the PCB, wherein the received optical signal is routed to an optical to electrical transceiver via a photonic cable across the first side of the PCB;
   the optical to electrical transceiver configured to receive the optical signal and convert the optical signal into split electrical signals; and
   a plurality of passive copper connectors disposed on a second, opposite side of the PCB, each connector configured to, receive at least some of the split electrical signals from the optical to electrical transceiver, and to absorb heat generated by the optical to electrical transceiver.

11. The chassis of claim 10, wherein each module of the plurality of modules is hot-swappable.

12. The chassis of claim 10, wherein the optical connector is configured to receive a hot-pluggable optical cable and wherein copper connectors are configured to receive hot-pluggable copper cables, and the electrical signals received by the copper connectors are transmitted over the received hot-pluggable copper cables.

13. The chassis of claim 10, further comprising a power and manageability PC card, wherein each module further includes a power connector and a manageability connector configured to connect to the power and manageability PCB of each respective module.

14. The chassis of claim 10, wherein each module includes a heat sink mounted on the first side of the PCB.

15. The chassis of claim 10, wherein the optical to electrical transceiver is further configured to route the split electrical signals across electrical channels vertically through the PCB to the plurality of copper connectors.

16. The chassis of claim 10, wherein the PCB of each module further includes a via that extends through the PCB and is disposed adjacent to a copper connector of the plurality of copper connectors to transfer heat from the optical to electrical transceiver to the copper connector.

17. A method of converting an optical signal to a plurality of electrical signals, the method comprising:
   receiving an optical signal at an optical connector on a first side of a printable circuit board (PCB);
   routing the optical signal to an optical to electrical transceiver via a photonic cable across the first side of the PCB;
   converting the optical signal into a plurality of split electrical signals via the optical to electrical transceiver; and
   routing the plurality of electrical signals to a plurality of electrical connectors disposed on a second, opposite side of the PCB, each electrical connector configured to receive the at least some of the plurality of split electrical signals, and to absorb heat generated by the optical to electrical transceiver.

18. The method of claim 17, further comprising transmitting the plurality of electrical signals from the plurality of electrical connectors to a plurality of servers.

19. The method of claim 17, wherein the electrical signals do not pass through any connector when routed from the first side of the PCB to the second side of the PCB.

* * * * *